United States Patent
Cho et al.

(10) Patent No.: US 9,634,162 B2
(45) Date of Patent: Apr. 25, 2017

(54) METHOD OF FABRICATING A(C)IGS BASED THIN FILM USING SE-AG2SE CORE-SHELL NANOPARTICLES, A(C)IGS BASED THIN FILM FABRICATED BY THE SAME, AND TANDEM SOLAR CELLS INCLUDING THE A(C)IGS BASED THIN FILM

(71) Applicant: KOREA INSTITUTE OF ENERGY RESEARCH, Daejeon (KR)

(72) Inventors: Ara Cho, Daejeon (KR); Kyung Hoon Yoon, Daejeon (KR); SeJin Ahn, Daejeon (KR); Jae Ho Yun, Daejeon (KR); Young Joo Eo, Daejeon (KR); Jihye Gwak, Daejeon (KR); Kee Shik Shin, Daejeon (KR); SeoungKyu Ahn, Daejeon (KR); Jun Sik Cho, Daejeon (KR); Jin-Su Yoo, Seoul (KR); Joo Hyung Park, Daejeon (KR)

(73) Assignee: Korea Institute of Energy Research (KR)

( * ) Notice: Subject to any disclaimer, the term of this patent is extended or adjusted under 35 U.S.C. 154(b) by 46 days.

(21) Appl. No.: 14/412,055

(22) PCT Filed: Sep. 3, 2013

(86) PCT No.: PCT/KR2013/007946
§ 371 (c)(1),
(2) Date: Dec. 30, 2014

(87) PCT Pub. No.: WO2014/098350
PCT Pub. Date: Jun. 26, 2014

(65) Prior Publication Data
US 2015/0287854 A1 Oct. 8, 2015

(30) Foreign Application Priority Data
Dec. 21, 2012 (KR) .................. 10-2012-0150680

(51) Int. Cl.
*H01L 31/0352* (2006.01)
*C01B 19/00* (2006.01)
(Continued)

(52) U.S. Cl.
CPC ...... *H01L 31/035209* (2013.01); *C01B 19/00* (2013.01); *C01B 19/007* (2013.01);
(Continued)

(58) Field of Classification Search
None
See application file for complete search history.

(56) References Cited

U.S. PATENT DOCUMENTS

| 2009/0242033 | A1 | 10/2009 | Yoon et al. | |
| 2011/0139251 | A1* | 6/2011 | Robinson | H01L 31/0322 136/262 |
| 2012/0168910 | A1* | 7/2012 | Jackrel | H01L 21/268 257/613 |

FOREIGN PATENT DOCUMENTS

| KR | 1020090065894 | 6/2009 |
| WO | 2012066386 | 5/2012 |
| WO | 2012075267 | 6/2012 |

OTHER PUBLICATIONS

International Search Report No. PCT/KR2013/007946; Sep. 9, 2013; 3 pages.

* cited by examiner

*Primary Examiner* — Nathan T Leong
(74) *Attorney, Agent, or Firm* — Mark E. Bandy; Rankin, Hill & Clark LLP

(57) ABSTRACT

A method of fabricating an Ag—(Cu—)In—Ga—Se (A(C)IGS) based thin film using Se—Ag$_2$Se core-shell nanoparticles, an A(C)IGS based thin film fabricated by the method, and a tandem solar cell having the A(C)IGS thin film are disclosed. More particularly, a method of fabricating a (Continued)

densified Ag—(Cu—)In—Ga—Se (A(C)IGS) based thin film by non-vacuum coating a substrate with a slurry containing Se—Ag$_2$Se core-shell nanoparticles, an A(C)IGS based thin film fabricated by the method, and a tandem solar cell including the A(C)IGS based thin film are disclosed. According to the present invention, an A(C)IGS based thin film including Ag is manufactured by applying Se—Ag$_2$Se core-shell nanoparticles in a process of manufacturing a (C)IGS thin film, thereby providing an A(C)IGS based thin film having a wide band gap.

13 Claims, 4 Drawing Sheets

(51) Int. Cl.
*H01L 31/18* (2006.01)
*H01L 31/032* (2006.01)
(52) U.S. Cl.
CPC ...... *H01L 31/0322* (2013.01); *H01L 31/0352* (2013.01); *H01L 31/1864* (2013.01); *C01P 2004/80* (2013.01); *C01P 2006/40* (2013.01)

METHOD OF FABRICATING A(C)IGS BASED THIN FILM USING SE-AG2SE CORE-SHELL NANOPARTICLES, A(C)IGS BASED THIN FILM FABRICATED BY THE SAME, AND TANDEM SOLAR CELLS INCLUDING THE A(C)IGS BASED THIN FILM

TECHNICAL FIELD

The present invention relates to a method of fabricating an Ag—(Cu—)In—Ga—Se (A(C)IGS) based thin film using Se—Ag$_2$Se core-shell nanoparticles, an A(C)IGS based thin film fabricated by the method, and a tandem solar cell including the A(C)IGS based thin film. More particularly, the present invention relates to a method of fabricating a densified Ag—(Cu—)In—Ga—Se (A(C)IGS) based thin film by non-vacuum coating a substrate with a slurry containing Se—Ag$_2$Se core-shell nanoparticles, an A(C)IGS based thin film fabricated by the method, and a tandem solar cell including the A(C)IGS based thin film.

BACKGROUND ART

Recently, importance on development of next-generation clean energy sources has increased due to the depletion of fossil fuel reserves. Thereamong, a solar cell is a device that converts solar energy directly into electricity. Solar cells can serve as an energy source to solve energy problems in the future, since they do not emit pollutants, have semi-permanent lifespan and utilize unlimited energy from the sun.

Solar cells may be divided into a variety of kinds depending upon materials used in a light-absorption layer, and the most currently available solar cell is a silicon solar cell. However, since silicon prices have been rising due to shortage of high purity silicon, a thin film type solar cell is drawing attention. The thin film type solar cell is fabricated to a thin thickness and thus contributes to less material consumption and light weight, thereby providing a wide application range. Copper Indium Gallium Selenide (CIGS) having high optical-absorption coefficient has been in the spotlight as a material for such a thin film solar cell. With the use of CIGS in the manufacture of solar cells, higher conversion efficiency can be obtained.

On the other hand, there is rising interest in tandem-structure solar cells presented as a solution to further improve efficiency of CIGS solar cells. The tandem-structure solar cell refers to a solar cell that has a multi-layer structure in which two unitary CIGS solar cells are stacked. However, since the tandem-structure solar cell is fabricated by first forming a bottom cell and then forming an upper cell thereon, the previously formed bottom cell can be damaged in the formation of the upper cell, thereby making it difficult to obtain sufficient energy-conversion efficiency.

Korean Patent Publication No. 10-2009-0065894A discloses a method of fabricating a tandem-type CIGS solar cell in which a metal nanoparticle layer is interposed between unitary cells to decrease an energy barrier at an interface between cells. However, this technique does not solve the problem of the previously-formed bottom cell being damaged in the process of forming the upper cell.

DOCUMENT OF RELATED ART

Korean Patent Publication No. 10-2009-0065894A

DISCLOSURE

Technical Problem

The present invention has been conceived to solve such problems in the related art, and it is an object of the present invention to provide a method of fabricating an Ag—(Cu—)In—Ga—Se (A(C)IGS) based thin film in which the thin film is densified at low temperature within a short time, thereby improving energy-conversion efficiency.

Technical Solution

It is another object of the present invention to provide an A(C)IGS based thin film fabricated by the method and a tandem solar cell including the A(C)IGS based thin film.

In accordance with one aspect of the present invention, a method of fabricating an Ag—(Cu—)In—Ga—Se (A(C)IGS) based thin film includes: preparing a slurry by blending Se—Ag$_2$Se core-shell nanoparticles, multi-component nanoparticles containing (Cu—)In—Ga—Se [(C)IGS] based elements, a solution precursor containing (C)IGS based elements, an alcohol solvent, and a binder (Step a); non-vacuum coating a substrate with the slurry to form an A(C)IGS based thin film (Step b); and heat-treating the A(C)IGS based thin film formed on the substrate for selenization thereof (Step c).

The Se—Ag$_2$Se core-shell nanoparticles have a structure in which a core of Se is surrounded by Ag$_2$Se. The multi-component nanoparticles may be a two-, three-, or four-component nanoparticle. The binder may include at least one element selected from the group consisting of a chelating agent and a non-chelating agent.

Here, the A(C)IGS based thin film is defined as an Ag—In—Ga—Se (AIGS) or Ag—Cu—In—Ga—Se (ACIGS) thin film.

Step a: Preparation of Slurry

The multi-component nanoparticles containing the (C)IGS based elements may include at least one kind of nanoparticles selected from the group consisting of Cu—Se nanoparticles, In—Se nanoparticles, Ga—Se nanoparticles, Cu—S nanoparticles, In—S nanoparticles, Ga—S nanoparticles, Cu—In—Se nanoparticles, Cu—Ga—Se nanoparticles, In—Ga—Se nanoparticles, Cu—In—S nanoparticles, Cu—Ga—S nanoparticles, In—Ga—S nanoparticles, Cu—In—Ga—Se nanoparticles, and Cu—In—Ga—S nanoparticles.

The multi-component nanoparticles may comprise at least two components of elements constituting IB-IIIA-VIA group compound semiconductors. For example, as described above, the multi-component nanoparticles may include Cu—Se nanoparticles, In—Se nanoparticles, Ga—Se nanoparticles, Cu—S nanoparticles, In—S nanoparticles, and Ga—S nanoparticles. Preferably, Cu—Se may be CuSe, Cu$_2$Se or Cu$_{2-x}$Se (0<x<1), In—Se may be In$_2$Se$_3$, Ga—Se may be Ga$_2$Se$_3$, Cu—S may be CuS or Cu$_{2-x}$S (0<x<1), In—S may be InS or In$_2$S$_3$, and Ga—S may be GaS or Ga$_2$S$_3$. Sulfur (S) contained in the multi-component nanoparticles is substituted with selenium (Se) in heat treatment for selenization described below. This serves to densify the thin film.

The multi-component nanoparticles may be prepared by any one of methods including a low-temperature colloidal method, a solvothermal synthesis method, a microwave method, and an ultrasonic synthesis method. However, the present invention is not limited thereto and the multi-component nanoparticles may be prepared by any methods known in the art.

The solution precursor may include at least one of (C)IGS based elements.

The solution precursor may include indium acetate, gallium acetylacetonate, and the like.

The solution precursor means a solution containing an element for forming an AIGS or ACIGS thin film. Here, the precursor may include elements other than those contained in the multi-component nanoparticles such that the precursor has a composition corresponding to that of the AIGS or ACIGS thin film. That is, when the nanoparticles comprise Cu—Se, the solution precursor is prepared by dissolving an In precursor and a Ga precursor, comprising chloride or acetate, with a chelating agent, followed by mixing the dissolved precursor with nanoparticles into a slurry.

The alcohol based solvent may include at least one selected from the group consisting of ethanol, methanol, pentanol, propanol, and butanol.

The alcohol based solvent may serve to adjust viscosity.

The binder may include a chelating agent, a non-chelating agent, or mixtures thereof.

These material can be used as a binder since they have own viscosity. For reaction of the Se—$Ag_2$Se core-shell nanoparticles and two-component nanoparticles with the solution precursor, the nanoparticles are combined with metal ions using the binder. As a result, the thin film is densified and forms a smooth surface. Here, the binder is added to the slurry in a mole fraction that enables chelation of the solution precursor.

The chelating agent may include at least one selected from the group consisting of mono ethanolamine (MEA), diethanolamine (DEA), triethanolamine (TEA), ethylenediamine, ethylenediaminetetraacetic acid (EDTA), nitrilotriacetic acid (NTA), hydroxyethylenediaminetriacetic acid (HEDTA), glycol-bis(2-aminoethylether)-N,N,N',N'-tetraacetic acid (GEDTA), triethylenetetraaminehexaacetic acid (TTHA), hydroxyethyliminodiacetic acid (HIDA), and dihydroxyethylglycine (DHEG), without being limited thereto. The chelating agent may include other chelating agents that are ligands capable of chelating metal ions and the nanoparticles which form an A(C)IGS based thin film, thereby forming a complex, within the scope of the present invention.

The non-chelating agent may include at least one selected from ethylene glycol, propylene glycol, ethylcellulose, polyvinyl pyrrolidone, and the like.

Here, in order to adjust the concentration of the slurry, the ratio of A(C)IGS based compound nanoparticles may be adjusted. Further, the ratio of the binder can also be adjusted to adjust the viscosity and a degree of binding of the slurry.

Step a may further include ultrasonication for mixing and dispersion of the slurry.

Step b: Formation of A(C)IGS Based Thin Film

The slurry prepared in Step a may be coated onto a substrate in a non-vacuum state so as to form an A(C)IGS based thin film.

Typically, in a 3-step co-evaporation process which is used to fabricate a CIGS thin film using a vacuum deposition technique well-known in the art, in the second step, Cu and Se are vacuum-deposited on a substrate while the temperature of the substrate is elevated to a melting point (~533° C.) of a Cu—Se binary compound such that the binary compound can serve as a flux, thereby densifying the thin film. Thus, in this case, a high temperature process is required, thereby making it difficult to form a thin film at a temperature lower than the melting point of the Cu—Se binary compound, and, even though the thin film is formed at a lower temperature than the melting point, the thin film has an incompact structure and can degrade quality of the solar cell when used as a CIGS solar cell.

However, in the non-vacuum coating method using Se—$Ag_2$Se core-shell nanoparticles according to the present invention, Se itself is present as a core in the core-shell structure like an egg yolk, instead of being present in the form of a binary or ternary compound, and diffuses from the structure upon initiation of a process, so that Se having a low melting point (217° C.) serves as flux at low temperature, thereby facilitating a low temperature process.

The formation of a thin film at low temperature may be advantageous particularly in fabricating a tandem solar cell described hereinafter. The tandem solar cell includes a multi-layer optical absorption layer, i.e. having a top cell and a bottom cell. Here, since the top cell is formed on the bottom cell, when the upper cell is coated onto the bottom cell at high temperature, the bottom cell can be damaged, thereby deteriorating operation efficiency of the solar cell. However, according to the present invention, since the upper cell is formed at low temperature, the upper cell can be formed without causing damage to the bottom cell, thereby maximizing operation efficiency of the solar cell.

Further, the present invention uses particles having a core-shell structure in which Se is surrounded by $Ag_2$Se. This structure prevents Se nanoparticles from being oxidized in air to four selenium oxide having a high melting point, or from adhering to each another to have an increased size in the process, thereby facilitating a smooth, compact thin film.

Further, since Se nanoparticles are coated with $Ag_2$Se, it is possible to form an AIGS or ACIGS thin film which is a material having a wide band gap. According to the present invention, a wide band gap material can be provided by a non-vacuum method.

Non-vacuum coating in Step b may be performed by any one method selected from spraying, ultrasonic spraying, spin coating, doctor-blade coating, screen printing, and inkjet printing, without being limited thereto. It should be understood that the present invention may employ any non-vacuum coating method well known in the art. While vacuum-coating requires heavy facility investment, the non-vacuum coating requires merely less facility investment and simplified process, thereby reducing manufacturing costs.

After coating, the method may further include drying. It is possible to remove the solvent through this process.

Coating and drying may be sequentially and repeatedly performed a plurality of times. Preferably, coating and drying may be repeated twice or three times as needed.

An A(C)IGS based thin film can be formed to a desired thickness by repeatedly performing non-vacuum coating and the drying.

Step c: Heat Treatment for Selenization

The A(C)IGS based thin film formed in Step b is subjected to heat treatment to form a selenide.

Heat treatment for selenization is an essential process in non-vacuum coating, which is carried out by increasing the temperature of the substrate, on which the thin film is formed, while supplying selenium vapor generated by thermally evaporating solid selenium. As a result, a selenide is formed on the precursor thin film subjected to non-vacuum coating in Step b and, at the same time, the structure of the thin film is densified and compacted, thereby forming an A(C)IGS based thin film.

Heat treatment for selenization in Step c may be performed at a substrate temperature ranging from 450° C. to 500° C. for 10 to 30 minutes. Unlike a conventional technique, the heat treatment for selenization may be performed at low temperature within a short time. Under these conditions, a maximally densified thin film structure can be formed, and such a thin film can be used for a solar cell having maximized energy-conversion efficiency.

In accordance with another aspect, the present invention provides an A(C)IGS based thin film which is used for an optical absorption layer of a tandem solar cell. The A(C)IGS based thin film is formed by coating a substrate with a slurry, which is prepared by mixing Se—$Ag_2Se$ core-shell nanoparticles, multi-component nanoparticles containing (C)IGS based elements, a solution precursor containing (C)IGS based elements, an alcohol based solvent, and a binder, wherein the Se—$Ag_2Se$ core-shell nanoparticles have a structure in which a core of Se is surrounded by $Ag_2Se$, wherein the multi-component nanoparticles are binary, ternary, or quaternary nanoparticles, and wherein, the binder includes at least one selected from the group consisting of a chelating agent and a non-chelating agent.

The A(C)IGS based thin film may be used for a top cell of a tandem solar cell.

In accordance with a further aspect, the present invention provides a tandem solar cell having an A(C)IGS based thin film used for a top cell as an optical absorption layer, wherein the A(C)IGS based thin film is formed by coating a substrate with a slurry prepared by mixing Se—$Ag_2Se$ core-shell nanoparticles, multi-component nanoparticles containing (C)IGS based elements, a solution precursor containing (C)IGS based elements, an alcohol based solvent, and a binder, wherein the Se—$Ag_2Se$ core-shell nanoparticles have a structure in which a core of Se is surrounded by $Ag_2Se$, wherein the multi-component nanoparticles are binary, ternary, or quaternary nanoparticles, and wherein the binder includes at least one selected from the group consisting of a chelating agent and a non-chelating agent.

Advantageous Effects

According to the present invention, the A(C)IGS based thin film can be fabricated using Se—$Ag_2Se$ core-shell nanoparticles to have a wide band gap due to Ag contained in the A(C)IGS based film. Further, since Se is present as a core in the core-shell structure like an egg yolk, instead of being present in the form of a binary or ternary compound, Se diffuses from the structure upon initiation of a process, whereby a thin film can be fabricated at low process temperature. Further, Se is coated with $Ag_2Se$ so as to prevent Se nanoparticles from being oxidized in air, or from adhering to each another to have an increased size in the process.

Furthermore, according to the present invention, the thin film is fabricated using a non-vacuum coating method and thus requires less facility investment, thereby securing excellent cost competitiveness to be advantageous in commercialization.

DESCRIPTION OF DRAWINGS

The above and other objects, features, and advantages of the present invention will become apparent from the detailed description of the following embodiments in conjunction with the accompanying drawings, in which.

MODE FOR INVENTION

Figure 1:
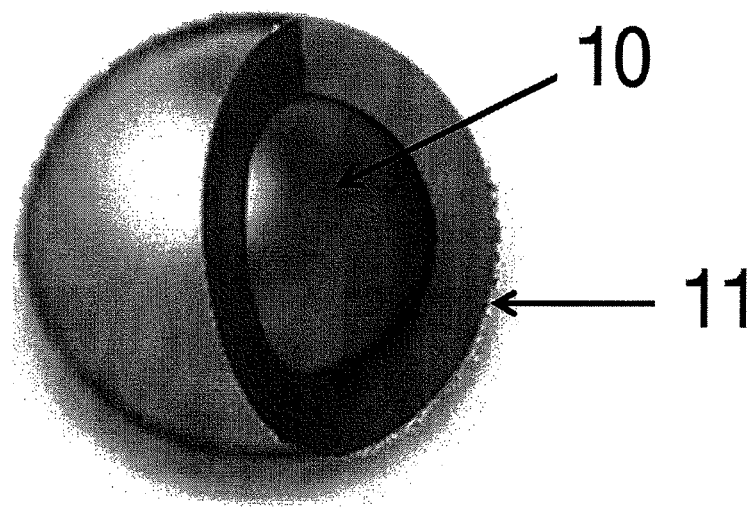
FIG. 1 is a schematic view of Se—$Ag_2Se$ core-shell nanoparticles prepared in Preparative Example 7.

Hereinafter, exemplary embodiments of the present invention will be described in detail with reference to the accompanying drawings. It should be understood that the present invention is not limited to the following embodiments and may be embodied in different ways. In addition, it should be understood that the following embodiments are provided for complete disclosure and thorough understanding of the invention by those skilled in the art. Thus, the present invention should not be limited by the following embodiments.

Preparative Example 1: Preparation of Cu—Se Binary Nanoparticle 7.618 g of CuI was mixed with 60 ml of distilled pyridine solvent in a glove box, followed by mixing with 3.1216 g of $Na_2Se$ dissolved in 40 ml of distilled methanol. By this process, an atomic ratio of Cu:Se of 1:1 was obtained. Thereafter, the mixture of methanol and pyridine was mechanically stirred and reacted in an ice bath at 0° C. for 7 minutes to prepare a colloid containing Cu—Se nanoparticles. The colloid was subjected to centrifugation at 10,000 rpm for about 10 minutes and then ultrasonication for 1 minute, followed by washing with distilled methanol. This process was repeated to completely remove pyridine and by-products from the resulting material, thereby preparing high-purity Cu—Se binary nanoparticles.

Preparative Example 2: Preparation of In—Se Binary Nanoparticle 4.9553 g of $InI_3$ was mixed with 30 ml of distilled tetrahydrofuran solvent in a glove box, followed by mixing with 1.874 g of $Na_2Se$ dissolved in 20 ml of distilled methanol. By this process, an atomic ratio of In:Se of 2:3 was obtained. Thereafter, the mixture of methanol and pyridine was mechanically stirred and reacted in an ice bath at 0° C. for 7 minutes to prepare a colloid containing In—Se nanoparticles. The colloid was subjected to centrifugation at 10,000 rpm for about 10 minutes and then ultrasonication for 1 minute, followed by washing with distilled methanol. This process was repeated to completely remove pyridine and by-products from the resulting material, thereby preparing high-purity In—Se binary nanoparticles.

Preparative Example 3: Preparation of Ga—Se Binary Nanoparticle 4.5044 g of $GaI_3$ was mixed with 30 ml of distilled tetrahydrofuran solvent in a glove box, followed by mixing with 1.874 g of $Na_2Se$ dissolved in 20 ml of distilled methanol. By this process, an atomic ratio of Ga:Se of 2:3 was obtained. Thereafter, the mixture of methanol and pyridine was mechanically stirred and reacted in an ice bath at 0° C. for 7 minutes to prepare a colloid containing Ga—Se nanoparticles. The colloid was subjected to centrifugation at 10,000 rpm for about 10 minutes and then ultrasonication for 1 minute, followed by washing with distilled methanol. This process was repeated to completely remove pyridine and by-products from the resulting material, thereby preparing high-purity Ga—Se binary nanoparticles.

Preparative Example 4: Preparation of In—S Binary Nanoparticle 4.9553 g of $InI_3$ was mixed with 30 ml of distilled tetrahydrofuran in a glove box, followed by mixing with 1.874 g of $Na_2S$ dissolved in 20 ml of distilled methanol. By this process, an atomic ratio of In:S of 2:3 was obtained. Thereafter, the mixture of methanol and pyridine was mechanically stirred and reacted in an ice bath at 0° C. for 7 minutes to prepare a colloid containing In—S nanoparticles. The colloid was subjected to centrifugation at 10,000 rpm for about 10 minutes and then ultrasonication for 1 minute, followed by washing with distilled methanol. This process was repeated to completely remove pyridine and by-products from the resulting material, thereby preparing high-purity In—S binary nanoparticles.

Preparative Example 5: Preparation of Cu—In—Se Ternary Nanoparticle 0.343 g of CuI and 0.991 g of $InI_3$ were mixed with 30 ml of distilled pyridine solvent in a glove box, followed by stirring on a hot plate of 50° C. for about 10 minutes. After stirring for about 10 minutes, the opaque solution became transparent. The mixture of Cu and In was mixed with 0.5 g of $Na_2Se$ dissolved in 20 ml of distilled methanol. By this process, an atomic ratio of Cu:In:Se of 0.9:1:2 was obtained. Thereafter, the mixture of methanol and pyridine was mechanically stirred and reacted in an ice bath at 0° C. for 1 minute to prepare a colloid containing CIS nanoparticles. The colloid was subjected to centrifugation at 4,000 rpm for about 30 minutes and then ultrasonication for 5 minutes, followed by washing with distilled methanol. This process was repeated to completely remove pyridine and by-products from the resulting material, thereby preparing high-purity CIS compound nanoparticles.

Preparative Example 6: Preparation of Cu—In—Ga—Se 4-Component Nanoparticle 0.343 g of CuI, 0.674 g of $InI_3$, and 0.207 g of $GaI_3$ were mixed with 30 ml of distilled pyridine solvent in a glove box, followed by stirring on a hot plate of 80° C. for about 10 minutes. After stirring for about 10 minutes, the opaque solution became transparent. The mixture of Cu, In, and Ga was mixed with 0.478 g of $Na_2Se$ dissolved in 20 ml of distilled methanol. By this process, an atomic ratio of Cu:In:Ga:Se of 0.9:0.68:0.23:1.91 was obtained. Thereafter, the mixture of methanol and pyridine was mechanically stirred and reacted in an ice bath at 0° C. for 60 minutes to prepare a colloid containing CIGS nanoparticles. The colloid was subjected to centrifugation at 4,000 rpm for about 30 minutes and then ultrasonication for 5 minutes, followed by washing with distilled methanol. This process was repeated to completely remove pyridine and by-products from the resulting material, thereby preparing high-purity 4-component CIGS nanoparticles.

Preparative Example 7: Preparation of Se—$Ag_2Se$ Core-Shell Nanoparticle

Selenious acid ($H_2SeO_3$, 99.999%), hydrazine monohydrate ($N_2H_4.H_2O$, 98%), and poly(vinyl pyrrolidone) (PVP, MW=55000) were purchased from Aldrich Corporation. Ethylene glycol ($HOCH_2CH_2OH$; EG; 99.9%) was purchased from Fluka Corporation. In a 250 ml round bottom flask, 80 ml of ethylene glycol (EG) was added to a hydrazine hydrate solution prepared using an ethylene glycol solvent (20 ml, 0.7 M) and then left in a water bath at 15° C. to 20° C. Thereafter, the resulting solution was stirred for 10 minutes by a magnet-stirring device and 20 ml of a selenious acid solution (0.07 M, solvent: EG) was added thereto and reacted for 1 hour. Thereafter, a PVP solution (2.4 g PVP and 80 ml EG) was added thereto. After hydrazine was completely removed through vacuum distillation, an $AgNO_3$ solution (0.1 g $AgNO_3$ and 1.5 ml EG) was added dropwise over 10 minutes, so that the solution changed from bright red to dark brown. After performing the reaction for 2 hours, 210 ml of water was added to the mixed solution, which were subjected to centrifugation to obtain core-shell nanoparticles. Thereafter, the nanoparticles were washed four times with water to remove EG and an excess of PVP. Then, the nanoparticles were dried through evaporation under ambient conditions, thereby preparing Se—$Ag_2Se$ core-shell nanoparticles (see FIG. 1).

Example 1: Fabrication of ACIGS Thin Film 0.0758 g of the Se—$Ag_2Se$ core-shell nanoparticles prepared in Preparative Example 7, 0.11233 g of the In—S nanoparticles prepared in Preparative Example 4, 0.0328 g of the Cu—Se nanoparticles prepared in Preparative Example 1, 1.9571 g of methanol, 0.0856 g of gallium acetylacetonate as a Ga solution precursor with an MEA solvent, and 0.1391 g of MEA (binder) were mixed, followed by ultrasonication for 60 minutes to prepare an ACIGS slurry. Here, the amount of methanol may be controlled for regulation of viscosity.

Thereafter, a soda-lime glass substrate having a Mo thin film was coated with the slurry by doctor-blade coating. Here, coating was performed with heights of the substrate and the blade set to 50 micrometers. For removal of the solvent and the binder, 3-step drying ($1^{st}$ step: 80° C. for 5 min; $2^{nd}$ step: 120° C. for 5 min; $3^{rd}$ step: 200° C. for 5 min) was performed on a hot plate. Here, drying may be performed under different temperature conditions so long as the solvent and the binder can be removed. Coating and drying were repeated three times to form a 0.509 μm thick precursor thin film.

Finally, heat treatment for selenization was performed for 15 minutes while supplying Se vapor at a substrate temperature of 450° C., thereby forming an ACIGS thin film.

Example 2

An ACIGS thin film was fabricated in the same manner as in Example 1, except that heat treatment for selenization was performed for 60 minutes while supplying Se vapor at a substrate temperature of 530° C.

Example 3

An ACIGS thin film was fabricated in the same manner as in Example 1, except that heat treatment for selenization was performed for 10 minutes while supplying Se vapor at a substrate temperature of 530° C.

Example 4: Fabrication of AIGS Thin Film 0.1050 g of the Se—Ag$_2$Se core-shell nanoparticles prepared in Preparative Example 7, 0.1470 g of the In—S nanoparticles prepared in Preparative Example 4, 1.3708 g of methanol, 0.1405 g of gallium acetylacetonate as a Ga solution precursor with an MEA solvent, and 0.1928 g of MEA (binder) were mixed, followed by ultrasonication for 60 minutes to prepare an AIGS slurry. Here, the amount of methanol may be controlled for regulation of viscosity.

Thereafter, a soda-lime glass substrate having a Mo thin film was coated with the slurry by doctor-blade coating. Here, coating was performed with heights of the substrate and the blade set to 50 micrometers. For removal of the solvent and the binder, 3-step drying (1$^{st}$ step: 80° C. for 5 min; 2$^{nd}$ step: 120° C. for 5 min; 3$^{rd}$ step: 200° C. for 5 min) was performed on a hot plate. Here, drying may be performed under different temperature conditions so long as the solvent and the binder can be removed. Coating and drying were repeated three times to form a 0.787 μm thick precursor thin film.

Finally, heat treatment for selenization was performed for 15 minutes while supplying Se vapor at a substrate temperature of 450° C., thereby forming an AIGS thin film.

Experimental Example 1: SEM Image Analysis

Figure 2:
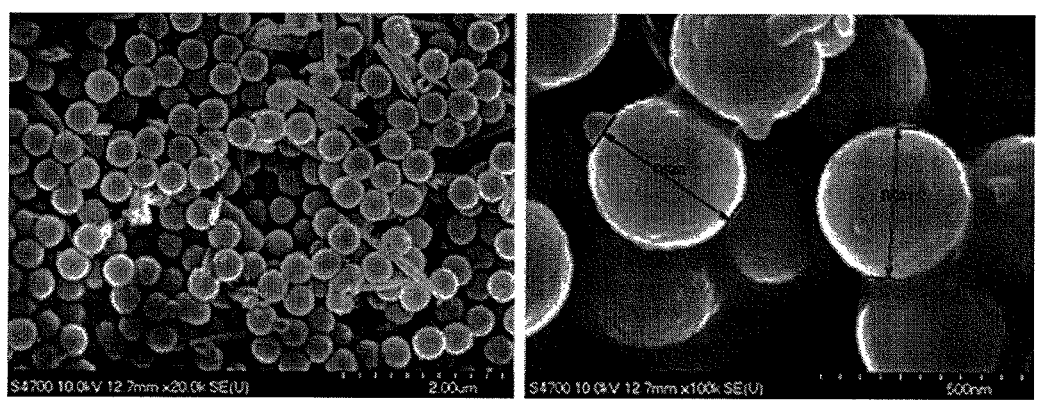
FIG. 2 is a SEM image of the Se—$Ag_2Se$ core-shell nanoparticles prepared in Preparative Example 7.

SEM (Scanning Electron Microscope) analysis results for Se—Ag$_2$Se core-shell nanoparticles according to Preparative Example 7, are shown in FIG. 2. The results demonstrate that homogeneous core-shell particles having a particle size of 370 nm to 380 nm were formed.

Experimental Example 2: XRD Analysis

Figure 3:
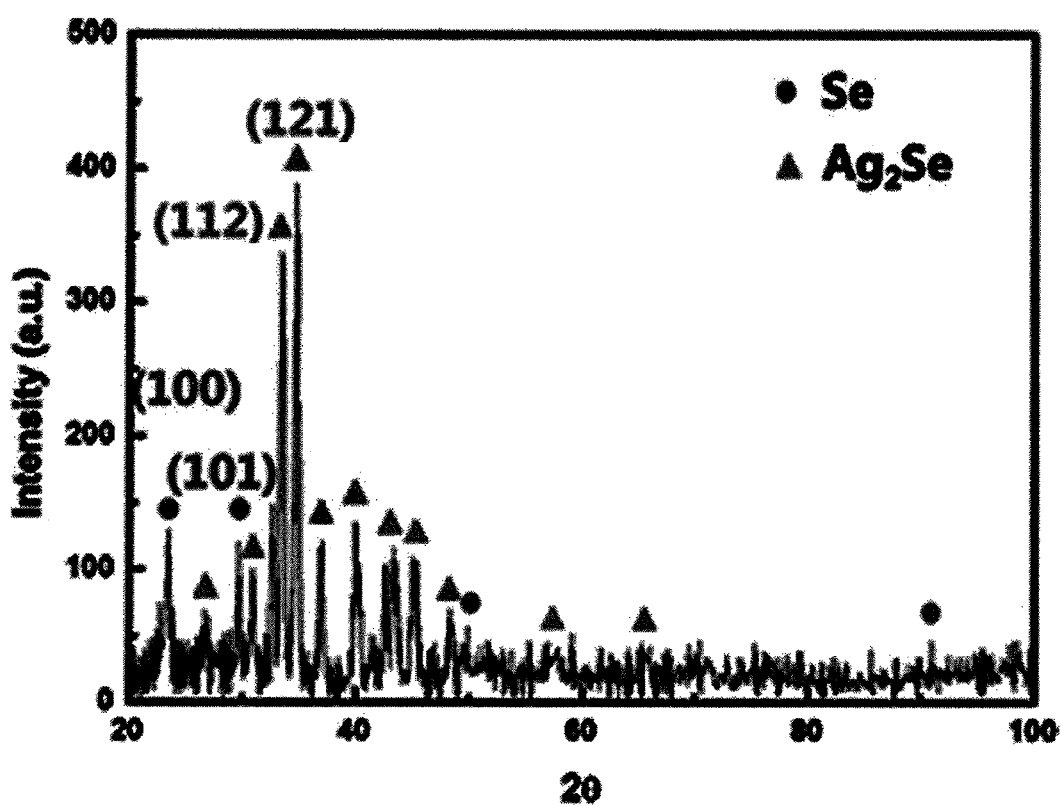
FIG. 3 is an XRD analysis result of the Se—$Ag_2Se$ core-shell nanoparticles prepared in Preparative Example 7.

XRD analysis results for Se—Ag$_2$Se core-shell nanoparticles according to Preparative Example 7 analyzed by X-ray diffraction are shown in FIG. 3. Since Se and Ag$_2$Se peaks are observed, it can be seen that Se, rather than binary nanoparticles is present. That is, in the case of the Se—Ag$_2$Se core-shell nanoparticles, since Se itself is present in the core-shell structure, not in the form of a binary or ternary compound, but as a core, Se diffuses from the structure upon initiation of the process, so that the fabrication process can be performed at low process temperature when using the Se—Ag$_2$Se core-shell nanoparticles.

Experimental Example 3: Surface Characteristics of ACIGS Thin Film

Figure 4:
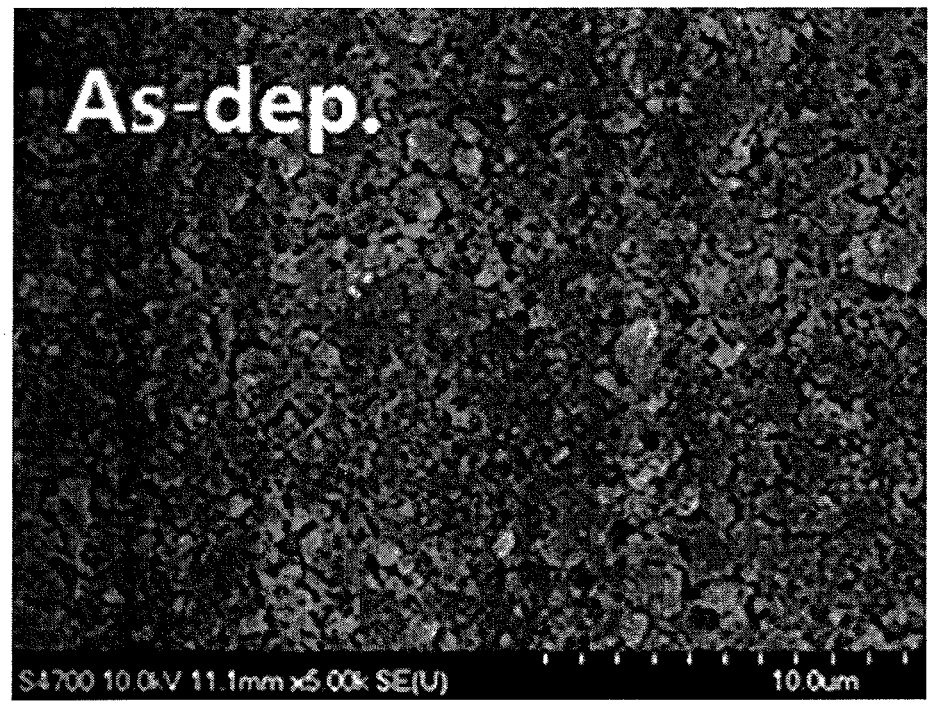
FIG. 4 shows a surface image of an ACIGS thin film prepared in Example 1 (before heat treatment for selenization)
Figure 5:
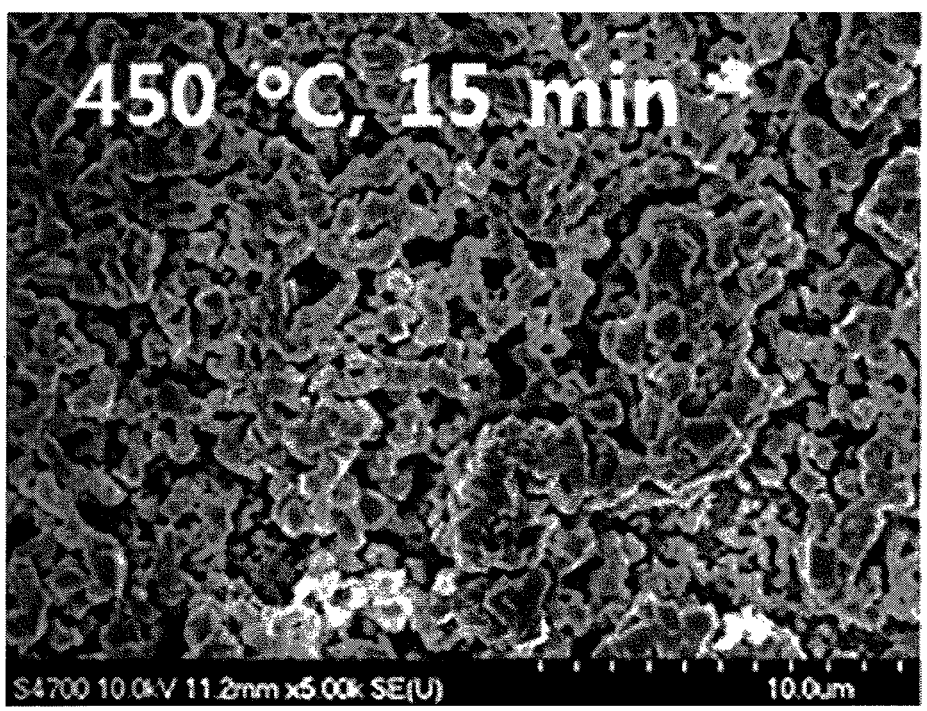
FIG. 5 shows a surface image of an ACIGS thin film after heat treatment for selenization.
Figure 6:
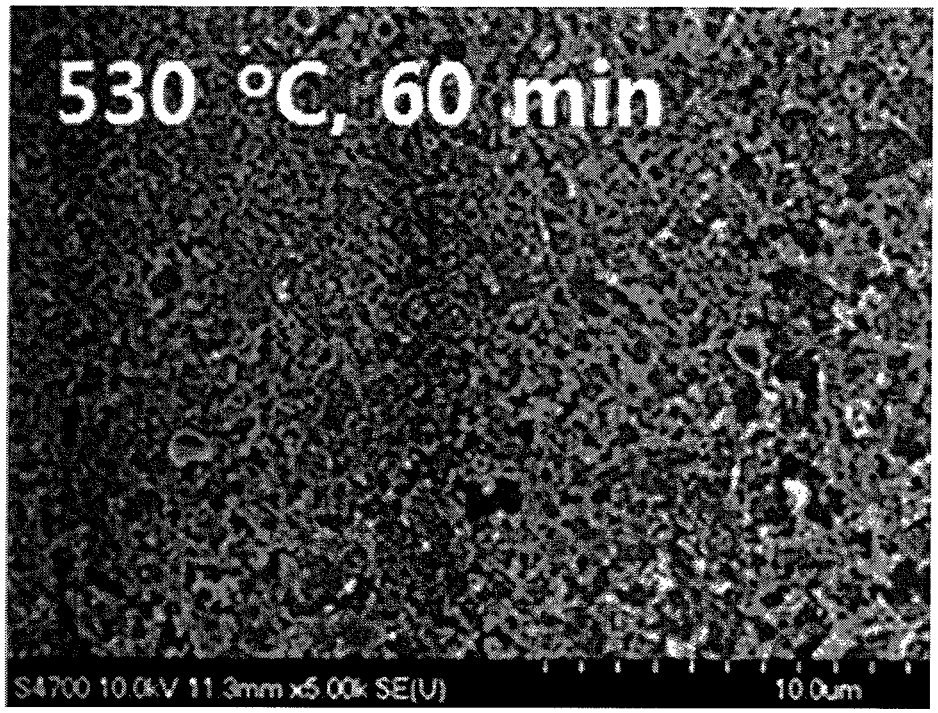
FIG. 6 shows a surface image of an ACIGS thin film prepared in Example 2.
Figure 7:
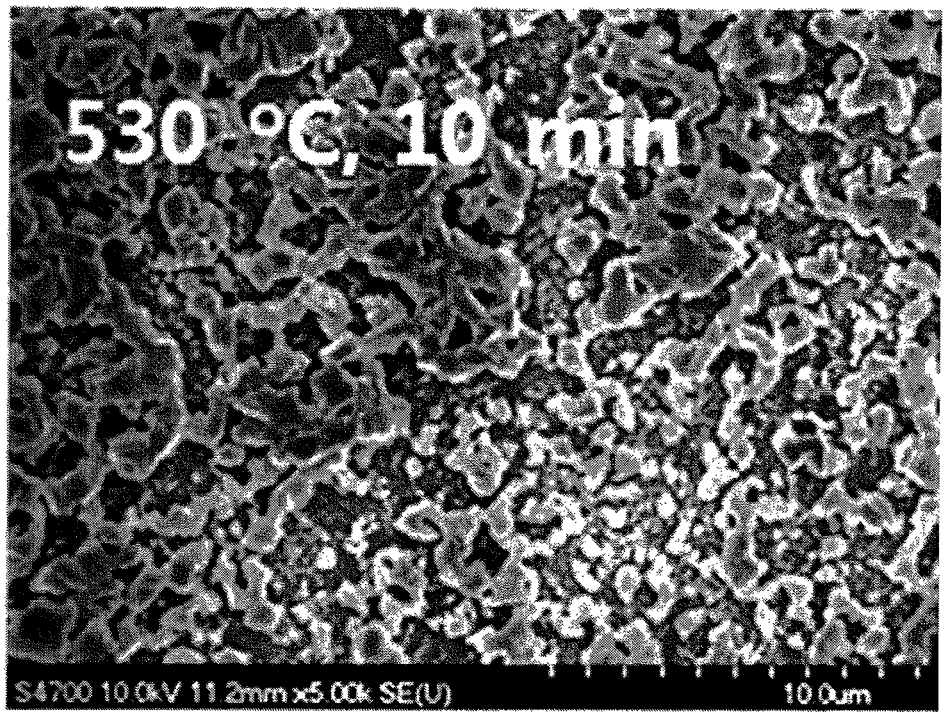
FIG. 7 shows a surface image of an ACIGS thin film prepared in Example 3.

FIG. 4 shows a surface image of the ACIGS thin film prepared in Example 1 (before heat treatment for selenization), FIG. 5 shows a surface image of the ACIGS thin film after heat treatment for selenization, FIG. 6 shows a surface image of the ACIGS thin film prepared in Example 2, and FIG. 7 shows a surface image of the ACIGS thin film prepared in Example 3. The results demonstrate that the thin film (FIG. 5) of Example 1, in which heat treatment for selenization was performed for 15 minutes at 450° C., had the most compacted structure.

Although some embodiments have been described above, it should be understood that these embodiments are given by way of illustration only, and that various modifications, variations, and alterations can be made without departing from the spirit and scope of the present invention. The scope of the present invention should be construed only by the accompanying claims and equivalents thereof.

The invention claimed is:

1. A method of fabricating an Ag—(Cu—)In—Ga—Se (A(C)IGS) based thin film, comprising:
    step (a) preparing a slurry by blending Se—Ag$_2$Se core-shell nanoparticles, multi-component nanoparticles containing at least one element selected from the group consisting of Cu, In, Ga, Se and S, a solution precursor containing at least one element selected from the group consisting of Cu, In, Ga, Se and S, an alcohol solvent, and a binder;
    step (b) non-vacuum coating a substrate with the slurry to form an A(C)IGS thin film; and
    step (c) heat-treating the A(C)IGS thin film formed on the substrate for selenization,
    wherein the Se—Ag$_2$Se core-shell nanoparticles have a structure in which a core of Se is surrounded by Ag$_2$Se,
    wherein the multi-component nanoparticles are binary, ternary, or quaternary nanoparticles, and
    wherein the binder comprises at least one selected from the group consisting of a chelating agent and a non-chelating agent.

2. The method according to claim 1, wherein the multi-component nanoparticles comprises at least one kind of nanoparticles selected from the group consisting of: Cu—Se nanoparticles, In—Se nanoparticles, Ga—Se nanoparticles, Cu—S nanoparticles, In—S nanoparticles, Ga—S nanoparticles, Cu—In—Se nanoparticles, Cu—Ga—Se nanoparticles, In—Ga—Se nanoparticles, Cu—In—S nanoparticles, Cu—Ga—S nanoparticles, In—Ga—S nanoparticles, Cu—In—Ga—Se nanoparticles, and Cu—In—Ga—S nanoparticles.

3. The method according to claim 1, wherein the multi-component nanoparticles are prepared by any one of methods including a low-temperature colloidal method, a solvothermal synthesis method, a microwave method, and an ultrasonic synthesis method.

4. The method according to claim 1, wherein the solution precursor comprises at least one element selected from the group consisting of Cu, In, Ga, Se, and S, other than the elements contained in the multi-component nanoparticles.

5. The method according to claim 1, wherein the solution precursor comprises at least one selected from the group consisting of indium acetate and gallium acetylacetonate.

6. The method according to claim 1, wherein the alcohol solvent comprises at least one selected from the group consisting of ethanol, methanol, pentanol, propanol, and butanol.

7. The method according to claim 1, wherein the chelating agent comprises at least one selected from the group consisting of monoethanolamine (MEA), diethanolamine (DEA), triethanolamine (TEA), ethylenediamine, ethylenediaminetetraacetic acid (EDTA), nitrilotriacetic acid (NTA), hydroxyethylenediaminetriacetic acid (HEDTA), glycol-bis (2-aminoethylether)-N,N, N',N'-tetraacetic acid (GEDTA), triethylenetetraaminehexaacetic acid (TTHA), hydroxyethyliminodiacetic acid (HIDA), and dihydroxyethylglycine (DHEG).

8. The method according to claim 1, wherein the non-chelating agent comprises at least one selected from the group consisting of ethylene glycol, propylene glycol, ethylcellulose, and polyvinyl pyrrolidone.

9. The method according to claim 1, wherein step (a) further comprises ultrasonication for mixing and dispersion of the slurry.

10. The method according to claim 1, wherein the non-vacuum coating of step (b) is performed by any one method selected from spraying, ultrasonic spraying, spin coating, doctor blade coating, screen-printing, and inkjet printing.

11. The method according to claim 1, wherein step (b) further comprises drying after the non-vacuum coating is performed.

12. The method according to claim 1, wherein step (b) comprises sequentially and repeatedly coating and drying a plurality of times.

13. The method according to claim 1, wherein step (c) is carried out at a substrate temperature ranging from 450° C. to 500° C. for 10 to 30 minutes.

\* \* \* \* \*